United States Patent
Shen et al.

(10) Patent No.: US 6,475,917 B1
(45) Date of Patent: Nov. 5, 2002

(54) METHOD TO REDUCE THE METAL TIN ARC DAMAGE IN ETCHING BACK PROCESS

(75) Inventors: Yun-Hung Shen, Taipei (TW); Yu-Lun Lin, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/428,573

(22) Filed: Oct. 28, 1999

(51) Int. Cl.7 ............................................. H01L 21/302
(52) U.S. Cl. ..................... 438/712; 438/715; 438/719; 438/723; 438/743
(58) Field of Search ................................ 438/706, 711, 438/710, 712, 715, 719, 623, 624, 723, 743

(56) References Cited

U.S. PATENT DOCUMENTS

| | | | |
|---|---|---|---|
| 5,399,533 A | * 3/1995 | Pramanik et al. | 438/624 |
| 5,458,687 A | * 10/1995 | Shichida et al. | 118/724 |
| 5,491,108 A | * 2/1996 | Suzuki et al. | 438/626 |
| 5,549,786 A | 8/1996 | Jones et al. | 156/662.1 |
| 5,552,346 A | * 9/1996 | Huang et al. | 438/699 |
| 5,665,657 A | * 9/1997 | Lee | 438/624 |
| 5,747,381 A | 5/1998 | Wu et al. | 438/624 |
| 5,747,382 A | 5/1998 | Huang et al. | 438/624 |
| 5,792,705 A | 8/1998 | Wang et al. | 438/624 |
| 5,814,564 A | * 9/1998 | Yao et al. | 438/723 |
| 5,843,847 A | 12/1998 | Pu et al. | 438/723 |

* cited by examiner

Primary Examiner—Benjamin L. Utech
Assistant Examiner—Binh X. Tran
(74) Attorney, Agent, or Firm—George O. Saile; Stephen B. Ackerman

(57) ABSTRACT

A method for forming on a substrate employed within a microelectronics fabrication a planarized inter-level metal dielectric (IMD) layer employing spin-on-glass (SOG) dielectric material, with attenuated etching damage to underlying layers. There is provided a substrate upon which is formed a patterned microelectronics layer over which is formed an inter-level metal dielectric (IMD) layer comprising a first silicon oxide dielectric layer and a second spin-on-glass (SOG) dielectric layer. The IMD layer is then planarized by plasma etchback method employing an etch cycle interrupted by an inert gas flushing step and substrate backside cooling by helium gas to control substrate temperature and etching reaction rates, resulting in attenuated damage to underlying layers resulting from over-etching of the IMD layer.

17 Claims, 2 Drawing Sheets

METHOD TO REDUCE THE METAL TIN ARC DAMAGE IN ETCHING BACK PROCESS

BACKGROUND OF THE INVENTION

1. Field of the Invention

The invention relates to the field of manufacture of microelectronics fabrications. More specifically the invention relates to the field of etching of microelectronics layers employed within microelectronics fabrications.

2. Description of the Related Art

Microelectronics devices are fabricated from layers of microelectronics materials formed sequentially upon substrates. Many of the layers are employed in patterns which must be held to fine tolerances dimensionally and compositionally. As the need for increasing component density within the microelectronics devices has grown, the dimensional requirements have also become more stringent. Likewise, the increased component density has led to the need for multiple levels of patterned conductor layers to interconnect the various circuits and components.

The conductor layers are commonly insulated from each other by inter-level metal dielectric (IMD) layers which must be formed to a high degree of surface planarity to permit high resolution patterns to be formed in upper-lying conductor layers with photolithographic methods as are well known and practiced in the art of microelectronics fabrications. To facilitate the formation of patterned conductor layers, it is often desirable to form over the conductor layer a second layer of another conductive material such as, for example, titanium nitride (TiN), which can serve as an anti-reflection coating (ARC) during photolithographic fabrication of the patterned conductor layer. Such additional surface layers are also sometimes formed on conductor layers to act as barrier layers against subsequent deleterious reactions.

It is highly desirable to minimize capacitance between conductor layers, and such inter-level metal dielectric (IMD) layers commonly are formed of multiple layers of dielectric materials wherein one or more dielectric layers are deposited possessing a particular property such as conformality followed by another material for dielectric properties such as, for instance, low dielectric constant. Often in sophisticated microelectronics devices the underlying topography is sufficiently varied at higher levels of fabrication that it is necessary to planarize further the IMD layer after formation. It is also a requirement that after formation of a planar IMD layer a series of contact via holes must be formed therein to permit interconnection of conductor layers. The formation of low resistance electrical contacts to conductor layers is sometimes facilitated by the formation of additional contact layers on the conductor layer.

Satisfactory IMD layers are formed within microelectronics fabrications employing combinations of dielectric materials such as silicon oxides formed by chemical vapor deposition (CVD) methods and silicon containing glass dielectric materials formed employing spin-on-glass (SOG) low constant dielectric materials. However, the IMD layers so formed are not without problems. For example, planarization of such IMD layers is commonly done by plasma etching methods at elevated temperatures. However, the SOG method inherently tends to form somewhat planar surfaces with resulting variations in IMD thickness over differing topographies and densities of surface features, hence it is necessary to minimize overetching of the IMD layer to avoid etching damage to an underlying ARC or barrier layer. It is also desirable to have a high selectivity of etch rate of the IMD SOG dielectric material over that of any underlying layer material to restrict the etch back reaction essentially to the IMD layer.

It is thus towards the goal of forming over substrates with topographic and pattern variations an inter-level metal dielectric (IMD) layer with improved planarization by subtractive etching back of the dielectric layer with attenuated damage to underlying material such as ARC or barrier layers that the present invention is generally directed.

Various methods have been disclosed for forming and planarizing an IMD layer employing SOG dielectric layer overlying a conductor layer by etching back the dielectric layer.

For example, Jones et al., in U.S. Pat. No. 5,549,786, disclose a method for forming a planarized surface layer of spin-on-glass (SOG) dielectric material with optimized etch selectivity with respect to underlying silicon nitride dielectric layers. The method employs a plasma sustained in a mixture of $CHF_3$, $N_2$ and He gases to etch back the SOG layer with a high etch rate selectivity over that of silicon nitride.

Further, Wu et al., in U.S. Pat. No. 5,747,381, discloses a method for forming a sacrificial layer of spin-on-glass (SOG) dielectric material over an inter-level dielectric (ILD) layer which is planarized by fully etching back the sacrificial SOG layer. The method employs a reactive ion etch (RIE) process to fully etch back the SOG layer into the ILD layer, both of which have comparable etch rates to the RIE environment. Any residual SOG may be further removed by wet etching in a buffered RF etch in which the SOG etches about 40 times faster than the ILD layer.

Still further, Huang et al., in U.S. Pat. No. 5,747,382, disclose a method for forming an inter-level metal dielectric (IMD) layer with attenuated void induced damage after planarization. The method employs chemical mechanical polish (CMP) planarization to open the voids and subsequent reactive ion etching after formation of the IMD layer to passivate and clean the voids.

Yet still further, Wang et al., in U.S. Pat. No. 5,792,705, disclose a method for forming a void-free dielectric layer over patterned conductor lines with a planar surface. The method employs formation of a dual dielectric liner layer of a first silicon oxide layer and then a second silicon nitride layer over the conductor lines, followed by formation of a spin-on-glass (SOG) layer over the lines. The resulting inter-level metal dielectric (IMD) layer is then etched back employing reactive ion etching to expose the underlying silicon nitride layer. After removal of the silicon nitride layer by reactive ion etching, a third dielectric layer is formed over the planarized surface.

Finally, Pu et al., in U.S. Pat. No. 5,843,847, disclose a method for etching a dielectric layer on a substrate providing high etching selectivity, high etch rates and low etch rate micro-loading. The method employs a plasma sustained in etching gases comprising fluorocarbon, carbon and nitrogen containing gases, and the use of inert gases such as helium is mentioned as an etch rate enhancement due to sputtering removal of the dielectric material by the inert gas ions.

Desirable in the art of microelectronics fabrication are additional methods for forming an IMD layer employing SOG dielectric material wherein the surface is planarized by means of plasma etch back method. More desirable are additional methods for planarizing by etching back IMD layers without damage to underlying anti-reflection and barrier layers such as titanium nitride (TiN) on conductor layers.

It is towards these goal that the present invention is generally and specifically directed.

SUMMARY OF THE INVENTION

It is a first object of the present invention to provide a method for forming on a substrate an inter-level metal dielectric (IMD) layer employing spin-on-glass (SOG) dielectric material with a planarized surface and attenuated damage to underlying layers.

It is a second object of the present invention to provide a method in accord with—the first object of the present invention, where a plasma etch back method is employed to form the planarized surface of the SOG dielectric layer.

It is a third object of the present invention to provide a method in accord with the first object of the present invention and the second object of the present invention, where the method is readily commercially implemented.

In accord with the present invention, there is provided a method for forming upon a substrate employed within a microelectronics fabrication a planarized inter-level metal dielectric (IMD) layer employing spin-on-glass (SOG) dielectric material, with attenuated damage to underlying layers due to over-etching of the dielectric layer. There is provided a substrate upon which is formed a patterned microelectronics layer over which is formed an inter-level metal dielectric (IMD) layer comprising a first silicon oxide dielectric layer and a second dielectric layer formed employing spin-on-glass (SOG) dielectric material The IMD layer is planarized by plasma etch back process employing a plasma reactive etch cycle interrupted by an inert gas flushing step and backside cooling of the substrate employing helium coolant gas to control substrate temperature and etching reaction rates, resulting in attenuated damage to underlying layers from over-etching of the IMD layer.

The present invention may be practiced on dielectric layers formed employing SOG materials deposited upon substrates employed within microelectronics fabrications including but not limited to integrated circuit microelectronics fabrications, charge coupled device microelectronics fabrications, solar cell microelectronics fabrications, ceramic substrate microelectronics fabrications, flat panel display microelectronics fabrications and optoelectronics display microelectronics fabrications.

The present invention may be practiced to particular advantage over substrates of varying surface topography and circuit density where the thickness of SOG layers is known to be variable. In such cases, the likelihood of removal of all of the SOG material where it is thinner is great, and a high selectivity ratio for etching SOG over an underlying barrier or ARC layer is highly desirable.

The present invention employs methods and materials which are known in the art of microelectronics fabrication, although in a novel order and sequence. There-fore the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming upon a substrate employed within a microelectronics fabrication an inter-level metal dielectric (IMD) layer which is planarized by plasma etchback method with attenuated damage to underlying layers.

First Preferred Embodiment

Figure 1:
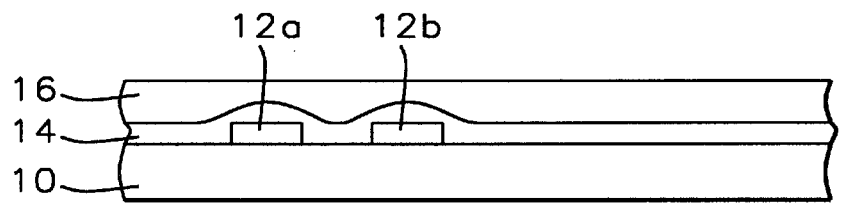
FIG. 1, FIG. 2 and FIG. 3 show a series of schematic cross-sectional drawings illustrating the results of progressive stages in forming upon a substrate employed within a microelectronics fabrication an inter-level metal dielectric (IMD) layer comprising spin-on-glass (SOG) dielectric material which is planarized by plasma etchback with attenuated damage to underlying layers in accord with a general embodiment of the present invention which constitutes a first preferred embodiment of the present invention.
Figure 2:
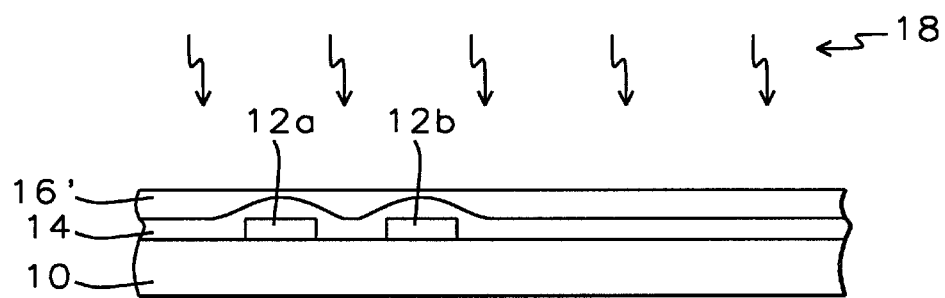
Figure 3:
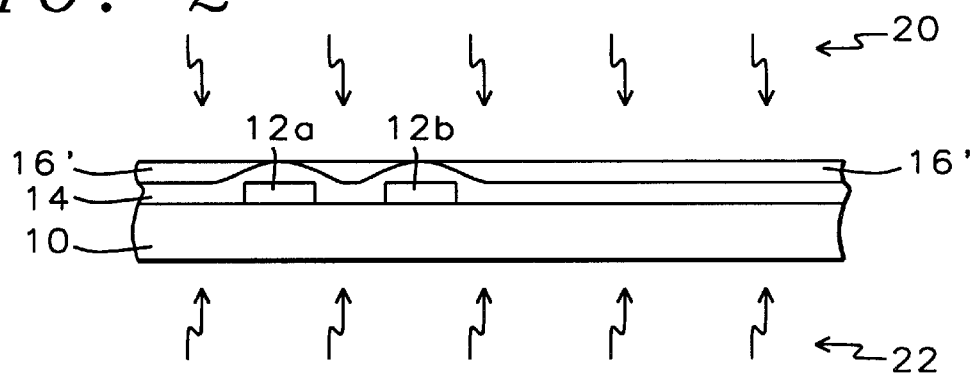

Referring now to FIGS. 1–3 , there is shown a series of schematic cross-sectional diagrams illustrating the results of progressive. stages in forming, upon a substrate employed within a microelectronics fabrication, an inter-level metal dielectric (IMD) layer comprising spin-on-glass (SOG) dielectric material, which is planarized by plasma etch back method with attenuated damage to underlying layers. FIG. 1 is a schematic cross-sectional diagram of the substrate employed within the microelectronics fabrication at an early stage in its fabrication in accord with a general embodiment of the present invention which constitutes a first preferred embodiment of the present invention.

Shown in FIG. 1 is a substrate 10 having formed thereupon a pair of microelectronics lines 12a and 12b which form a patterned microelectronics layer. Formed over the substrate 10 and patterned microelectronics layer is a first dielectric layer 14 formed employing silicon oxide dielectric material. Formed over the substrate is a second dielectric layer 16 formed employing spin-on-glass (SOG) low dielectric constant dielectric material.

With respect to the substrate 10 shown in FIG. 1, the substrate 10 may be the substrate itself employed within the microelectronics fabrication, or the substrate 10 may be any of several layers of microelectronics materials as are known in the art of microelectronics fabrication, including but not limited to microelectronics conductor materials, microelectronics semiconductor materials and microelectronics dielectric materials. The substrate 10 is employed within a microelectronics fabrication including but not limited to integrated circuit microelectronics fabrications, charge coupled device microelectronics fabrications, solar cell microelectronics fabrications, radiation emitting microelectronics fabrications, optoelectronics microelectronics fabrications, ceramic substrate microelectronics fabrications and flat panel display microelectronics fabrications.

With respect to the pair of microelectronics lines 12a and 12b shown in FIG. 1, the pair of microelectronics lines 12a and 12b constitutes a patterned microelectronics layer formed upon the substrate 10. The pair of microelectronics lines which form a patterned microelectronics layer is formed employing microelectronics material selected from the group consisting of microelectronics conductor materials, microelectronics semiconductor materials and microelectronics dielectric materials formed employing methods known in the art of microelectronics fabrication including but not limited to vacuum evaporation methods, chemical vapor deposition (CVD) methods, physical vapor deposition (sputtering) methods and electrochemical methods. Preferably the microelectronics lines 12a and 12b are formed of a material with a negative temperature coefficient for plasma etching reaction rate which differs substantially from the temperature coefficient for plasma etching reaction rate for silicon oxide dielectric layer 14 and spin-on-glass dielectric layer 16 shown in FIG. 1.

With respect to the first dielectric layer 14 shown in FIG. 1, the first dielectric layer 14 is a silicon oxide dielectric layer formed employing methods known in the art of microelectronics fabrication including but not limited to chemical vapor deposition (CVD), plasma enhanced chemical vapor deposition (PECVD), sub-atmospheric thermal chemical vapor deposition (SACVD) and low pressure chemical vapor deposition (LPCVD). Preferably the silicon oxide dielectric layer 14 is formed employing the following process conditions: (1) silicon source gas tetra-ethyl-orthosilicate (TEOS) at a gas flow rate of about 2300 standard cubic centimeters per minute (sccm); (2) ozone ($O_3$) gas flow rate of about 5500 standard cubic centimeters per minute (sccm); and (3) temperature about 400 degrees centigrade. Preferably the silicon oxide dielectric layer is formed to a thickness of from about 7000 to about 9000 angstroms.

With respect to the second dielectric layer 16 shown in FIG. 1, the second dielectric layer 16 is formed employing a spin-on-glass (SOG) dielectric material known in the art of microelectronics fabrication including but not limited to SOG dielectric materials such as organosiloxane, silsesquioxane (SQ), hydrogen silsesquioxane (HSQ), methyl sesquioxane (MSQ), and carbon bonded fluorocarbon (FC). Preferably the second dielectric layer 16 is formed employing Number 314 SOG spin-on-glass (SOG) dielectric material to a thickness of from about 4000 to about 6000 angstroms.

Referring now more particularly to FIG. 2, there is shown a schematic cross-sectional diagram illustrating the result of further processing of the microelectronics fabrication whose schematic cross-sectional diagram is shown in FIG. I in accord with the first preferred embodiment of the present invention. Shown in FIG. 2 is a microelectronics fabrication otherwise equivalent to the microelectronics fabrication shown in FIG. 1, but where there has been planarized the surface of the IMD layer by plasma etch back method 18.

With respect to the plasma etch back method 18 employed in FIG. 2, the plasma etch back method 18 employs the following process conditions: (1) reactive gases: tetrafluoromethane ($CF_4$) at a flow rate of about 45 standard cubic centimeters per minute (sccm) and trifluoromethane ($CHF_3$) at a flow rate of about 25 standard cubic centimeters per minute (sccm); (2) inert gases argon at a flow rate of about 450 standard cubic centimeters per minute (sccm) and helium at a gas flow rate of about 10 standard cubic centimeters per minute (sccm); (3) pressure about 300 millitorr; (4) temperature from about 25 to about 50 degrees centigrade; (5) radiofrequency of 400 kilohertz (kHz); (5) power 900 watts. The plasma etch back process is carried out from about 25 seconds to about 50 seconds to remove the bulk of the SOG dielectric material.

The plasma etch back reaction process employed in FIG. 2 is selected so as to provide a negative temperature coefficient for the reaction rate for silicon oxide dielectric layer which is substantially smaller than the temperature coefficient for the reaction rate for the microelectronics material forming lines 12a and 12b, such that at lower temperature the rate of removal of silicon oxide material becomes increasingly greater than the rate of removal of the underlying material; i.e. the selectivity of the etch rate for silicon oxide increases with decreasing temperature.

Referring now more particularly to FIG. 3, there is shown a schematic cross-sectional diagram illustrating the results of further processing of the microelectronics fabrication whose schematic cross-sectional diagram is shown in FIG. 2 in accord with the first preferred embodiment of the present invention. Shown in FIG. 3 is a microelectronics fabrication otherwise equivalent to the microelectronics fabrication shown in FIG. 2, but where there has been completed the etch back process employing first an interruption of the etching reaction 20 to permit flushing of the substrate surface with an inert gas to cool the substrate and a supply of helium cooling gas to the backside of the substrate 22 to control substrate temperature when the etching reaction is resumed to completion.

With respect to the interruption of the etching reaction 20 shown in FIG. 3, the interruption of the etching reaction 20 provides cooling of the substrate with an inert gas flush. With respect to the helium gas substrate backside cooling 22, the helium cooling gas 22 provides additional temperature control when the etching back of the SOG dielectric layer is resumed to completion.

The gas flushing interruption of the etching reaction employs the following process conditions: (1) helium gas; (2)gas flow rate of about 1000 standard cubic centimeters per minute (sccm); (3) pressure about 100 millitorr.

The helium cooling gas supplied to the backside of the substrate employs the following process conditions: (1) helium gas flow rate of about 25 standard cubic centimeters per minute (sccm); (2) pressure about 10 torr; (3) inlet temperature about 25 degrees centigrade. Preferably the helium cooling gas process maintains a substrate temperature of from about 25 to about 50 degrees centigrade.

The reduction of temperature due to the gas flush and the helium backside cooling serve to lower the temperature of the substrate so that the etching rate of the underlying microelectronics layer formed from lines 12a and 12b, which has a greater negative temperature coefficient for the reaction rate than does the overlying silicon oxide dielectric layer 14', is substantially lower than that of the silicon oxide dielectric layer 14'. Thus the selectivity of the etch rate of silicon oxide dielectric material over that of the underlying material is greatly enhanced, allowing the silicon oxide dielectric layer to be removed completely if necessary for improved planarity, without etching the underlying material significantly.

The present invention provides a method for forming an inter-level metal dielectric (IMD) layer on a substrate employed within a microelectronics fabrication which is planarized employing a plasma etchback method. The method employs an interruption of the etching reaction to provide an inert gas flush to cool the substrate, followed by helium gas cooling of the backside of the substrate to maintain or reduce temperature control during the resumption of the etch back process to completion. Due to the greater temperature coefficient for reaction rate of the underlying material compared to silicon oxide dielectric material, the greater a selectivity of the silicon oxide dielectric etch rate results in attenuated etching damage to underlying layers.

The interruption of the etch back reaction due to flushing of the substrate with argon gas permits the generation of reactive species such as $O_2$ from the dielectric layer material which aids in additional removal of the SOG layer during the process.

Second Preferred Embodiment

Figure 4:
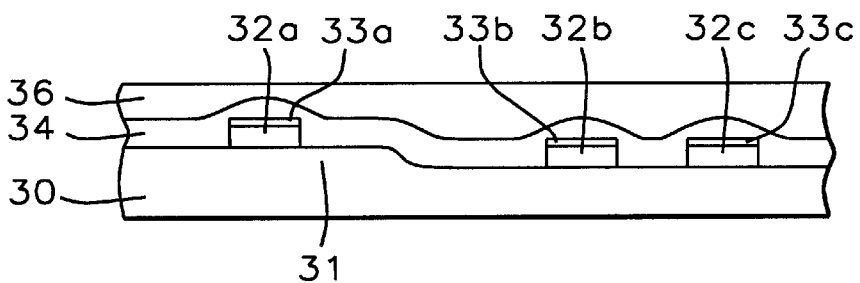
FIG. 4, FIG. 5, FIG. 6 and FIG. 7 show a series of schematic cross-sectional diagrams illustrating the results of progressive stages in forming upon a semiconductor substrate with topographic variation employed within an integrated circuit microelectronics fabrication an inter-level metal dielectric (IMD) layer, formed employing a first silicon oxide dielectric layer and a second dielectric layer formed employing low dielectric constant spin-on-glass (SOG) dielectric material, formed over a patterned dual conductor layer of titanium nitride on aluminum, wherein the IMD layer is planarized over the substrate by plasma etchback method with attenuated damage to the underlying titanium nitride layer, in accord with a more specific embodiment of the present invention which constitutes a second preferred embodiment of the present invention.

Referring now more particularly to FIGS. 4–7, there is shown a series of schematic cross-sectional diagrams illustrating the results of progressive stages in the formation, upon a semiconductor substrate employed within an integrated circuit microelectronics fabrication, an inter-level metal dielectric (IMD) layer comprising spin-on-glass (SOG) dielectric material which is planarized by plasma etch back method with attenuated damage to underlying conductor layers. FIG. 4 is a schematic cross-sectional diagram illustrating a semiconductor substrate at an early stage in its fabrication in accord with a more specific embodiment of the present invention which constitutes a second preferred embodiment of the present invention.

Shown in FIG. 4 is a semiconductor substrate 30 with topographic variation 31 employed within an integrated circuit microelectronics fabrication. Formed over the semiconductor substrate is a series of conductor lines 32a, 32b and 32c over which is formed a second conductive series of contiguous lines 33a, 33b and 33c, which two series taken together constitute a composite patterned conductor layer. Formed over the semiconductor substrate is a first dielectric layer 34 employing silicon oxide dielectric material. Formed over the substrate is a second dielectric layer 36 formed employing spin-on-glass (SOG) low dielectric constant dielectric material.

With respect to the semiconductor substrate 30 shown in FIG. 4, the semiconductor substrate 30 is a silicon semiconductor substrate of n- or p-type doping. Preferably the silicon semiconductor substrate is a single crystal substrate of (100) crystal orientation.

With respect to the topographic variation 31 shown in FIG. 4, the topographic variation 31 is formed by underlying structures of the integrated circuit microelectronics fabrication as are known in the art of integrated circuit microelectronics fabrication. Such typical underlying structures are formed of microelectronics materials including microelectronics conductor materials, microelectronics semiconductor materials and microelectronics dielectric materials employing methods known in the art of microelectronics fabrication including but not limited to vacuum evaporation methods, chemical vapor deposition (CVD) methods, physical vapor deposition (sputtering) methods, electrochemical methods and photolithographic pattern formation methods.

With respect to the series of conductor lines 32a, 32b and 32c shown in FIG. 4, the series of conductor lines 32a, 32b and 32c is analogous to the pair of microelectronics lines 12a and 12b shown in FIG. 1 of the first preferred embodiment of the present invention. The series of microelectronics conductor lines 33a, 33b and 33c shown in FIG. 1 contiguous with the lines 32a, 32b and 32c constitute together a patterned composite microelectronics conductor layer formed employing conductor materials and methods as are known in the art of microelectronics fabrications. Preferably the series of microelectronics conductor lines 32a, 32b and 32c is formed of aluminum, and the series of microelectronics conductor lines 33a, 33b and 33c is formed of titanium nitride (TiN) The layer of titanium nitride is employed as an anti-reflection coating (ARC). Preferably the aluminum layer is formed to a thickness of about 3000 angstroms, and the titanium nitride (TiN) layer is formed to a thickness of about 500 angstroms.

With respect to the first dielectric layer 34 shown in FIG. 4, the first dielectric layer 34 is analogous or equivalent to the first silicon oxide dielectric layer 14 shown in FIG. 1 of the first preferred embodiment of the present invention.

With respect to the second dielectric layer 36 shown in FIG. 4, the second dielectric layer 36 is analogous or equivalent to the second dielectric layer 16 shown on FIG. 1 of the first preferred embodiment of the present invention. Together the first and second dielectric layers constitute an inter-level metal dielectric (IMD) layer.

Figure 5:
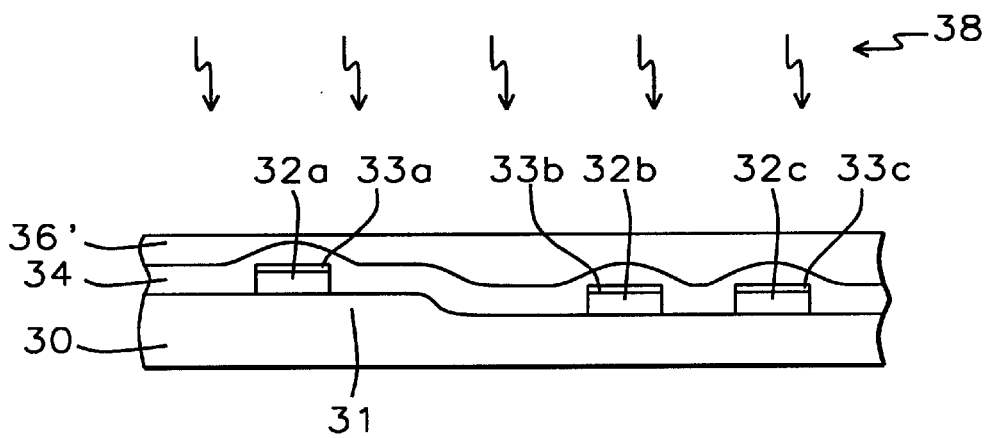

Referring now more particularly to FIG. 5, there is shown a schematic cross-sectional diagram illustrating the results of further processing of the integrated circuit microelectronics fabrication whose schematic cross-sectional diagram is shown in FIG. 4 in accord with the second preferred embodiment of the present invention. Shown in FIG. 5 is an integrated circuit microelectronics fabrication otherwise to the integrated circuit microelectronics fabrication shown in FIG. 4, but where there has been planarized the surface of the IMD layer 36' plasma etch back method 38.

With respect to the plasma etch back method 38 shown in FIG. 5, the plasma etch back method 38 is analogous or equivalent to the plasma etch back method shown in FIG. 2 of the first preferred embodiment of the present invention.

Figure 6:
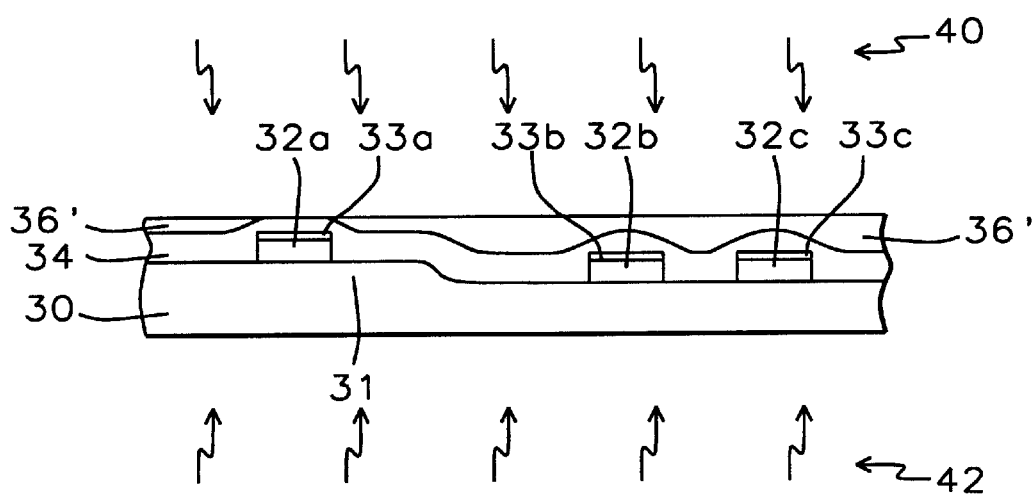

Referring now more particularly to FIG. 6, there is shown a schematic cross-sectional diagram illustrating the results of further processing of the integrated circuit microelectronics fabrication shown in FIG. 5 in accord with the second preferred embodiment of the present invention. Shown in FIG. 6 is an integrated circuit microelectronics fabrication otherwise equivalent to the integrated circuit microelectronics fabrication shown in FIG. 5, but where there has been completed the planarization etch back process on the IMD layer 36' and 34', employing first an interruption of the etching reaction 40 to permit flushing of the substrate surface with inert gas to cool the substrate, and subsequently a supply of helium gas coolant 42 to the back of the substrate 30 to control substrate temperature during the completion of the etching reaction.

With respect to the inert gas flushing 40 and the helium coolant gas 42 shown in FIG. 6, the inert gas flushing 40 and the helium coolant gas 42 are analogous or equivalent to the inert gas flushing 20 and the helium coolant gas 22 shown in FIG. 3 of the first preferred embodiment of the present invention.

Figure 7:
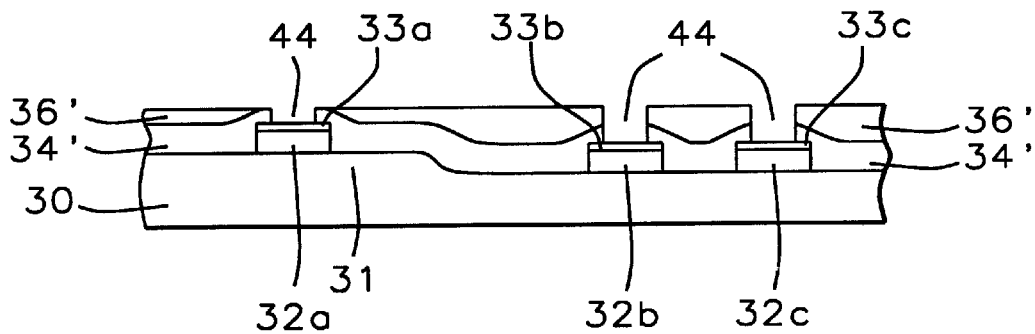

Referring now more particularly to FIG. 7, there is shown a schematic cross-sectional diagram illustrating the results of final processing of the integrated circuit microelectronics fabrication whose schematic cross-sectional diagram is shown in FIG. 6 in accord with the second preferred embodiment of the present invention. Shown in FIG. 7 is an integrated circuit microelectronics fabrication otherwise equivalent to the integrated circuit microelectronics fabrication shown in FIG. 6, but where there has been etched contact via holes 44 to permit interconnection to underlying microelectronics conductor lines 32a, 32b and 32c which constitute a patterned microelectronics layer.

With respect to the contact via holes 44 shown in FIG. 7, the contact via holes 44 are formed employing methods and materials as are well known in the field of integrated circuit microelectronics fabrication.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for forming upon a substrate employed within a microelectronics fabrication an inter-level metal dielectric (IMD) layer which is planarized with attenuated damage to underlying layers comprising:

providing a substrate;

forming upon the substrate a patterned microelectronics layer;

forming over the substrate an inter-level metal dielectric (IMD) layer further comprising:
a first silicon oxide dielectric layer;
a second dielectric layer formed employing spin-on-glass (SOG) dielectric material; and planarizing the surface of the inter-level metal dielectric (IMD) layer employing plasma etch back method, wherein the patterned microelectronics layer is formed of material having a greater negative temperature coefficient of etching reaction rate by the plasma etch back method than that of the silicon oxide dielectric material, and wherein the SOG dielectric material is selectively etched at a greater rate than is the silicon oxide dielectric material and the patterned microelectronics layer material.

2. The method of claim 1 wherein the substrate is employed within a microelectronics fabrication selected from the group consisting of:
integrated circuit microelectronics fabrications:
charge coupled device microelectronics fabrications;
solar cell microelectronics fabrications;
radiation emitting microelectronics fabrications;
optoelectronics microelectronics fabrications;
ceramic substrate microelectronics fabrications; and
flat panel display microelectronics fabrications.

3. The method of claim 1 wherein the series of lines forming a patterned microelectronics layer is formed from materials selected from the group consisting of:
microelectronics conductor materials;
microelectronics semiconductor materials; and
microelectronics dielectric materials.

4. The method of claim 1 wherein the first silicon oxide dielectric layer is formed employing methods selected from the group consisting of:
plasma enhanced chemical vapor deposition (PECVD) method;
high density plasma chemical vapor deposition (HDP-CVD) method;
sub-atmospheric pressure thermal chemical vapor deposition (SACVD); and
low pressure chemical vapor deposition (LPCVD) method.

5. The method of claim 1 wherein the second dielectric layer is formed employing spin-on-glass (SOG) dielectric material selected from the group consisting of:
organosiloxane;
silsesquioxane (SQ);
hydrogen silsesquioxane (HSQ);
methyl silsesquioxane (MSQ); and
carbon bonded fluorocarbon (FC).

6. The method of claim 1 wherein the plasma etch back method consists of:
plasma etch back of SOG dielectric layer; and
temperature control of the substrate during etch back.

7. The method of claim 6 wherein the temperature control of the substrate is accomplished by means comprising:
interruption of plasma etching with argon gas flush; and
resumption of etching back with helium gas cooling of backside of substrate.

8. The method of claim 6 wherein the plasma etch back process comprises:
tetrafluoromethane and trifluoromethane reactive gases;
argon and helium inert gases;
radiofrequency 400 kilohert;
power about 900 watts; and
temperature from about 25 to about 50 degrees centigrade.

9. A method for forming upon a semiconductor substrate, with varying topography and circuit density employed within an integrated circuit microelectronics fabrication, an inter-level metal dielectric (IMD) layer which is planarized with attenuated damage to underlying conductor layer comprising:

providing a semiconductor substrate;

forming over the semiconductor substrate a first series of conductor lines and a second contiguous series of conductor lines which constitute together a patterned microelectronics conductor layer;

forming over the substrate a first silicon oxide dielectric layer;

forming over the substrate a second dielectric layer employing a spin-on-glass (SOG) low dielectric constant dielectric material to complete the inter-level metal dielectric (IMD) layer; and planarizing the surface of the IMD layer employing plasma etch back method, wherein the patterned microelectronics layer is formed of material having a greater negative temperature coefficient of etching reaction rate by the plasma etch back method than that of the silicon oxide dielectric material, and wherein the SOG dielectric material is selectively etched at a greater rate than is the silicon oxide dielectric material and the patterned microelectronics layer material.

10. The method of claim 9 wherein the first conductive series of lines are formed employing aluminum conductor material and the second contiguous series of conductive lines are formed of titanium nitride (TiN) conductor material.

11. The method of claim 9 wherein the first silicon oxide dielectric layer is formed employing methods selected from the group consisting of:
plasma enhanced chemical vapor deposition (PECVD) method;
high density plasma chemical vapor deposition (HDP-CVD method;
sub-atmospheric pressure thermal chemical vapor deposition (SACVD) method; and
low pressure chemical vapor deposition (LPCVD) method.

12. The method of claim 9 wherein the second dielectric layer is formed employing spin-on-glass (SOG) dielectric material selected from the group consisting of:
- organosiloxane;
- silsesquioxane (SQ);
- hydrogen silsesquioxane (HSQ);
- methyl silsquioxane (MSQ); and
- carbon bonded fluorocarbon (FC).

13. The method of claim 9 wherein the plasma etch back process comprises:
- reactive gases tetrafluoromethane and trifluoromethane;
- argon and helium inert gases;
- radiofrequency 400 kilohertz;
- power about 900 watts; and
- temperature from about 125 to about 50 degrees centigrade.

14. The method of claim 9 further comprising:
- forming contact via holes through the IMD layer after planarization.

15. The method of claim 9 wherein the semiconductor substrate is a silicon semiconductor substrate.

16. The method of claim 9 wherein the plasma etch back method consists of:
- plasma etch back of SOG dielectric layer; and
- temperature control of the substrate during etch back.

17. The method of claim 16 wherein the temperature control of the substrate is accomplished by means comprising:
- interruption of plasma etching back with inert gas flush; and
- resumption of plasma etching back with helium gas cooling of backside of the substrate.

* * * * *